United States Patent [19]

Melse

[11] Patent Number: 5,339,052

[45] Date of Patent: Aug. 16, 1994

[54] OSCILLATOR CIRCUIT HAVING A FIFTY PERCENT DUTY CYCLE

[75] Inventor: Abraham L. Melse, Nijmegen, Netherlands

[73] Assignee: U.S. Philips Corporation, New York, N.Y.

[21] Appl. No.: 75,709

[22] Filed: Jun. 11, 1993

[30] Foreign Application Priority Data

Jun. 15, 1992 [EP] European Pat. Off. ........ 92201740.5

[51] Int. Cl.[5] .............................................. H03B 5/36
[52] U.S. Cl. .................. 331/75; 331/116 FE; 331/158
[58] Field of Search ........ 331/74, 75, 116 R, 116 FE, 331/158

[56] References Cited

U.S. PATENT DOCUMENTS 4,383,224 5/1983 Saari ...................................... 331/74

FOREIGN PATENT DOCUMENTS 558160 1/1980 Japan.

Primary Examiner—Siegfried H. Grimm
Attorney, Agent, or Firm—Bernard Franzblau

[57] ABSTRACT

An oscillator circuit having a 50% duty cycle comprises an oscillating stage and an output stage. The output stage comprises a series arrangement of first and second output transistors of complementary conductivity types. The oscillating stage applies a combination of an oscillating signal and a first DC bias to the gate of the first output transistor. The first DC bias is dependent on the amplitude of the oscillating signal. The oscillator circuit also includes a bias-generating circuit for generating a second DC bias at the gate of the second transistor, so as to adjust the input switching level to the median level of the input signal dependent upon the amplitude of the oscillating signal.

5 Claims, 1 Drawing Sheet

OSCILLATOR CIRCUIT HAVING A FIFTY PERCENT DUTY CYCLE

BACKGROUND OF THE INVENTION

This invention relates to an oscillator circuit comprising an oscillating stage and an output stage, the oscillating stage being coupled to an input of the output stage for feeding an input signal combining a generated oscillating signal with a first DC bias, said first DC bias being dependent on the amplitude of the oscillating signal, the output stage comprising a series arrangement of main current channels of a first and a second output transistor of complementary conductivity types, coupled between a first and a second supply terminal the input being coupled to a control electrode of the first transistor and, via a capacitor, to a control electrode of the second transistor, a node in the series arrangement between the first and the second transistor being coupled to an output of the oscillator circuit, the output stage, in operation, driving an output voltage to switch substantially between a first and a second output level when the input signal crosses an input switching level.

Such an oscillator circuit is known from JP 55-8160.

The oscillating stage is conveniently used to generate both the oscillating signal and the first DC bias for driving the output stage. For example, as in JP 55-8160, the oscillating stage usually comprises a feedback loop including the control electrode of a transistor similar to that of the first transistor. The control voltage of this transistor is used to apply the first DC bias as well as the oscillating signal in the form of the input signal to the output stage.

In general, the oscillating signal produced by the oscillating stage will not be binary but, for example, sine-shaped when the control electrode of the transistor in the oscillating stage receives its signal via a frequency-selective network as in JP 55-8160. Moreover, the oscillating signal will have an amplitude which may depend on partially uncontrollable factors like IC processing parameters or ambient temperature.

The purpose of the output stage is to derive a substantially binary output signal from the oscillating signal. In operation, the output stage will drive the output voltage from the first level, which is close to the supply voltage at the first supply terminal, to the second level, which is close to the supply voltage at the second supply terminal, and back.

An important property of the output signal is its duty cycle, i.e., the percentage of time during which it is at the first level. For many applications the duty cycle should be fixed at 50%. However, the duty cycle is affected by the relative positions of the first DC bias and the switching level. For example, if the first DC bias is lowered with respect to the switching level, a sine-shaped input signal will be above the switching level for a shorter time, causing a lower duty cycle.

The problem of providing a DC bias as well as an oscillating signal from the oscillating stage is thus that non-linearities in the transistor in the feedback loop will usually cause the amplitude of the oscillating signal to influence the first DC bias level generated in the oscillating stage. Consequently, the known oscillator circuit has the drawback that the duty cycle will be influenced by the amplitude. Since the exact amplitude of the oscillating signal depends on partially uncontrollable factors, this means that the duty cycle will also be partially uncontrolled.

SUMMARY OF THE INVENTION

It is an object of the invention to provide an oscillator circuit in which the duty cycle is made 50%, substantially independent of the amplitude of the oscillating signal.

The oscillator circuit according to the invention is characterized in that the oscillator circuit comprises bias-generating means for generating a second DC bias at a control electrode of the second transistor, in dependence upon the amplitude, for adjusting the input switching level to the median level of the input signal. By making the second DC bias depend on the amplitude as well, the switching level itself is made dependent on the amplitude. In particular, the switching level is adjusted to a level providing a 50% duty cycle, i.e., to the median level (which, conventionally, is the level separating the range of input signal values into an upper and a lower half which are visited equally often by the input signal). Thus, compensation is provided for the effect upon the duty cycle of the amplitude dependence of the first DC.

An embodiment of the oscillator circuit according to the invention is characterized in that an AC coupling is provided between the oscillating stage and the bias-generating means for applying a further oscillating signal of said amplitude to the bias-generating means. In the bias-generating means the second DC bias is made dependent on the amplitude received via the AC coupling so as to adjust the switching level and achieve compensation.

A further embodiment of the oscillator circuit according to the invention, in which the oscillating stage comprises a sub-circuit determining the first DC bias and its dependence on the amplitude, is characterized in that for generating the second DC bias, the bias-generating means comprise a complementary circuit, having a circuit arrangement which is complementary to the sub-circuit, the AC coupling being arranged for providing equivalent signals in the sub-circuit and the complementary circuit. Thus the part of the oscillating stage which is responsible for the dependence on the amplitude, i.e. the sub-circuit, is copied in a complementary version in the biasgenerating means. The components causing the actual oscillation are not copied. The AC coupling ensures that equivalent signals occur in the oscillating stage and the complementary circuit, whereby the complementary circuit thus causes an equivalent amplitude dependence in the second DC bias. The effects of the amplitude dependence of the first and second DC bias upon the switching level should be equal in magnitude and opposite to each other. The effect should be equivalent only in the sense that it is not necessary for the amplitude dependence of the first and second DC bias to be equal themselves.

In a further embodiment of the oscillator circuit the oscillating stage comprises a first feedback loop including a control electrode and a main current channel of a third transistor which has its control electrode coupled to the input of the output stage. It is advantageous to provide both the first DC bias and the oscillating signal using the first feedback loop. It is particularly the non-linear behaviour of a third transistor in this first feedback loop which is responsible for the amplitude dependence problem amplitude. According to the invention, this embodiment is therefore characterized in that the complementary circuit comprises a second feedback loop including a control electrode and a main current channel of a fourth transistor which has its control electrode coupled to the control electrode of the second transistor, the AC coupling comprising a capacitive element connecting the control electrodes of the third and fourth transistors. The fourth transistor in the bias-generating means is therefore a copy of the third transistor. The AC coupling ensures that the third and fourth transistors receive equivalent AC signals. In this way they will cause the same amplitude dependence.

BRIEF DESCRIPTION OF THE DRAWING

These and other aspects of the invention will be apparent from and elucidated with reference to the embodiments described hereinafter. In the drawing.

DESCRIPTION OF THE PREFERRED EMBODIMENTS

Figure 1:
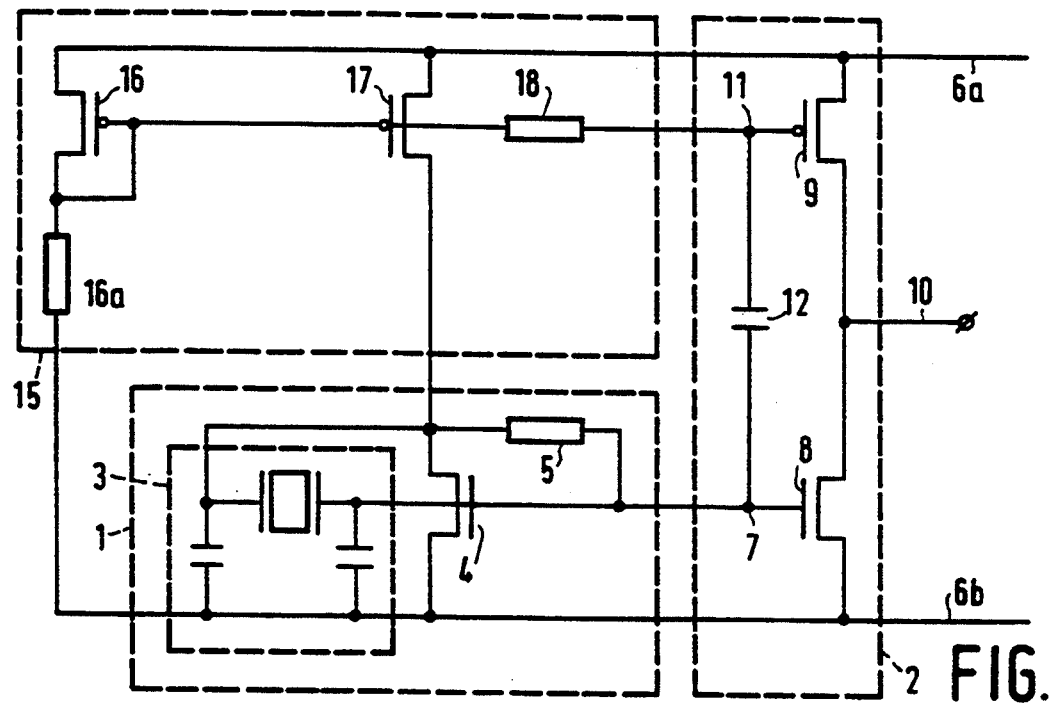
FIG. 1 shows a prior art oscillator circuit.

FIG. 1 shows a known oscillator circuit comprising an oscillating stage 1 and an output stage 2.

The oscillating stage is a Pierce oscillator comprising an amplifying element (in this case an NMOS transistor 4) which is part of a feedback loop which also comprises a feedback network 3 with a piezoelectric crystal. The NMOS transistor 4 is also connected to a resistive element 5 (for example, a resistor or the channel of a transistor whose control gate is at a fixed potential), also in a feedback configuration.

The output stage 2 is arranged between two power supply lines 6a, 6b and comprises the series arrangement of an NMOS transistor 8 and a PMOS transistor 9. The output of the output stage is a node 10 between the NMOS transistor 8 and the PMOS transistor 9.

The gate of the NMOS transistor 4 of the oscillating stage 1 is connected to the gate (connection) 7 of the NMOS transistor 8, which gate (connection) is the input of the output stage 2. The gate of the NMOS transistor 4 of the oscillating stage 1 is coupled to the gate (connection) 11 of the PMOS transistor 9 via a capacitor 12.

The circuit comprises a reference circuit 15 constructed as a series connection of a resistive element 16a and a PMOS transistor 16 arranged as a diode. The gate of this transistor is connected to the gate of a PMOS transistor 17 in a current mirror configuration with the "diode" transistor 16. The gate of the "diode" transistor is coupled to the gate 11 of the PMOS transistor 9 of the output stage via a resistive element 18.

In operation, the oscillating stage 1 produces an oscillating signal at a frequency which is substantially determined by the feedback network 3. The output stage 2 is used to convert the oscillating voltage into an essentially binary output voltage. This will be explained as follows. As is known, the drain-source current is only weakly dependent on the drain-source voltage when the drain-source voltage of a PMOS or an NMOS transistor is above a saturation level. In this case the drain-source current is determined mainly by the gate-source voltage.

In the output stage 2 the PMOS and the NMOS transistors receive distinct gate voltages; in most cases these would lead to distinct drain-source currents if the drain-source voltages of the two transistors were both above the saturation level. However, since the two transistors are arranged in series, they must draw the same current. Hence, the drain-source voltage of one of the output transistors 8, 9, notably the transistor which would otherwise draw the largest current, must be below its saturation level. Consequently, the voltage at the output 10 will always be driven between extremes at which alternately one of the transistors 8, 9 has a drain-source voltage below saturation level.

Switching between the extremes is effected when the gate voltages have such values that the drain-source currents will be equal when the drain-source voltages of both transistors 8, 9 are above the saturation level. This will be referred to as the switching condition. When the gate-source voltage of the PMOS transistor 9 is fixed, the voltage at the output node 10 will switch over when the voltage at the gate (connection) 7 reaches a switching level which gives rise to the switching condition.

The percentage of time that the voltage at the output node is at one of the extremes is referred to as the duty cycle of the output signal. It is desirable that this duty cycle is fixed and approximates 50%. At very low amplitudes of the oscillating signal this is achieved by ensuring that the gate voltages of the output transistors 8, 9 in the absence of an oscillating signal, are set in such a way that the switching condition is met.

Consequently, the voltage at the gate 7 of the NMOS output transistor 8 will be at the switching level in the absence of the oscillating signal. If the oscillating signal moves symmetrically around this level, an output signal with a duty cycle of 50% will result.

However, the oscillating signal will disturb the average DC bias at the gate (connection) 7 of the output NMOS transistor. A simple illustration of this which is intended as a non-limitative example is presented below. A simple model for the drain-source current of the transistor 4 in the oscillating stage is written as $$I_{DS} = \beta(V_{GS} - V_T)^2$$

The average drain-source current $I_{av}$ of the transistor 4 in the oscillating stage is determined by the current reference. The average of the right-hand member of the equation above must correspond to this average:

$$I_{av}/\beta = (V_{DC} - V_T)^2 + \sigma^2_{osc}$$

where $V_{DC}$ is the average of the voltage at the input 7 which is also the gate of the transistor in the oscillating stage, i.e. its DC bias, and $\sigma_{osc}$ is its standard deviation, i.e. the amplitude of the oscillating signal. Since the left-hand member of this relation and $V_T$ are fixed, the DC bias $V_{DC}$ must depend on the amplitude $\sigma_{osc}$. At the same time, in the circuit according to FIG. 1, the DC bias of the PMOS transistor in the output stage is independent of the amplitude. The reference circuit 15 cannot respond to the oscillating signal because this signal is kept out of the reference circuit 15 (or at best is coupled to it only in a much attenuated form) by the resistive element 18.

Consequently, the duty cycle will depend on the amplitude of the oscillating signal: switching is only affected at the phase of the oscillating signal where its instantaneous value balances the amplitude-dependent DC bias at the input (connection) terminal 7.

According to the invention, the DC bias at the gate of the PMOS transistor 9 of the output stage (referred to as the second DC bias, in contradistinction to the DC bias at the gate (connection) of the NMOS transistor, which will hereinafter be referred to as the first DC bias) is adjusted to compensate for the amplitude dependence in the first DC bias. As indicated above, these amplitude dependences need not be equal; what is important is that there are equal amplitude dependences in the drains source currents which will occur when both the transistors 8, 9 have a drain-source voltage above the saturation level.

One way of adjusting the second DC bias is the use of a feedback loop which measures the difference from a 50% duty cycle and feeds back a voltage proportional to this difference to the gate of the PMOS output transistor. However, a simpler construction uses a feed-forward arrangement.

Figure 2:
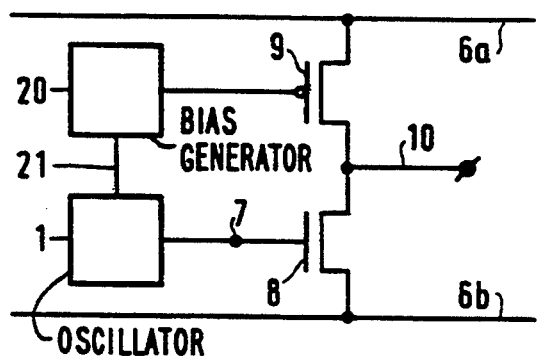
FIG. 2 shows an embodiment of an oscillator circuit according to the invention.

This is shown in FIG. 2. Here the oscillator circuit comprises biasgenerating means 20. An AC coupling 21 is arranged between the oscillating stage 1 and the bias-generating means 20. This coupling applies (furnishes) the oscillating signal to the bias-generating means which generate the second DC bias for the gate (connection) 11 of the PMOS transistor.

The circuits are arranged in such a way that in the absence of an oscillating signal the output stage will be at the switching level. This is a matter of simple initial DC setting, requiting the output transistors 8, 9 to draw equal currents when their drain-source voltages are both above the saturation level. The feedback network 3 will pass only a single harmonic of the oscillation to the gate (connection) 7. Hence, the oscillating signal will be inherently symmetric in shape.

The bias-generating means 20 are arranged to generate the second DC bias in dependence on the amplitude received via the AC coupling 21. This dependence is arranged to shift the switching level of the output stage 2, thereby compensating for the effect upon the duty cycle of the amplitude dependence of the first DC bias.

A simple way of providing this compensation is to ensure that the mechanism causing the amplitude dependence of the first DC bias is copied to the bias-generating means. The idea is that by using components having the same non-linearities as the oscillating stage, and by supplying them with the same signals as the oscillating stage, an amplitude dependence can be obtained for the second DC bias which is equivalent to the amplitude dependence of the first DC bias.

Hence, in the bias-generating means 20 complementary copies of at least those parts of the oscillating stage 1 are included which determine for the amplitude dependence of the first DC bias. Of course it is not necessary or desirable to copy the entire oscillating stage. In particular, the bias-generating means need not generate its own oscillating signal because the oscillating signal is supplied to the copies via the AC coupling. In principle, an AC coupling using a capacitor may be provided. If several different oscillating signals are needed in the bias-generating means, the AC coupling may have several capacitors.

Figure 3:
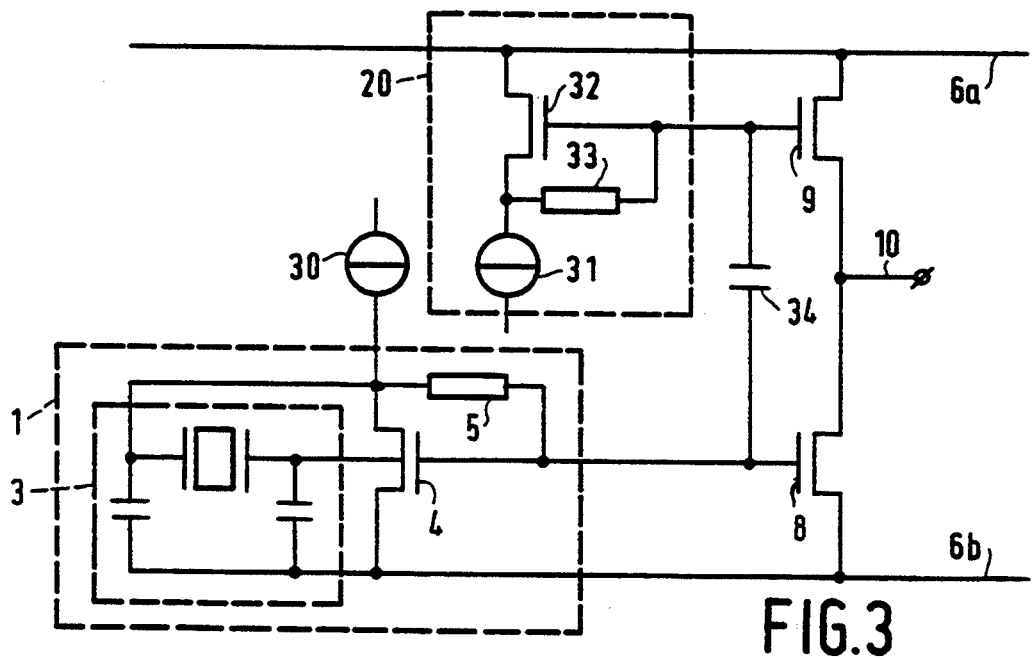
FIG. 3 shows a second embodiment of an oscillator circuit according to the invention.

An example of the copy principle is shown in FIG. 3. Here the oscillating stage, which is similar to that of FIG. 1, comprises a feedback loop including an NMOS transistor 4 and a resistive element 5 coupled between its drain and gate. This feedback loop, and in particular the non-linearity of the transistor, determines the amplitude dependence of the first DC bias. The drain-source channel is supplied by a current source 30. Accordingly, a complementary copy of the determinant components is provided in the bias-generating means: they comprise a further feedback loop with a transistor 32 and a resistive element 33 coupled between its drain and gate. The drain-source channel of the transistor is supplied by a current source 31.

The AC coupling is also provided, which coupling uses a capacitor 34 arranged to ensure that substantially equivalent AC signals are present at electrodes of the transistor 4 in the oscillating stage and its complementary copy 32 in the bias-generating means 20. The AC signals at the electrodes will give rise to equivalent AC currents through the channel of the transistor 4 and its complementary copy transistor 32.

The AC coupling 34 is also coupled directly to the gate of the PMOS transistor 9 in the output stage 2. Consequently, the output stage will also be more sensitive to the oscillating signal, which is important for oscillators operating at a low voltage. This also improves the speed of the transition between the first and second output levels. The improvement of the duty cycle alone would be achieved if, for example, a further resistive element were arranged between the AC coupling and the gate of complementary copy transistor 32 (on the one hand), the PMOS output transistor 9 (on the other hand). In this case the further resistive element would prevent the oscillating signal from reaching the gate of the PMOS output transistor 9.

The resistive element 5, which is part of the mechanism causing the amplitude dependence, is also copied as a resistive element 33. The essential function of this resistive element 33 is only to provide a DC feedback between source and gate. The resistive elements 5, 33 are so large that they do not draw any appreciable AC current. Hence, it is not necessary to copy the exact value of the resistive element: it is sufficient that both the resistive element 5 and its copy 33 are large enough to prevent any appreciable AC current from flowing.

It should be noted that the oscillator stage 1 forms a first current mirror in combination with the NMOS output transistor 8. The bias-generating means 20 forms a second current mirror in combination with the PMOS output transistor 9. The current sources 31 and 30 at the input branches of these mirrors are dimensioned in such a way that in the absence of an oscillating signal they will produce identical output currents in the output stage when the drain-source voltages are above the saturation level. To ensure this, the current sources may, for example, refer to a common current reference (either via current mirrors, or by coupling input branches in series via a current reference element). In the absence of an oscillating signal, the input (connection) terminal 7 of the output stage 2 will be at the switching level, as is evidenced by the fact that the output branches carry identical currents.

The presence of an oscillating signal in the oscillator causes the first DC bias to shift, giving the first current mirror a different DC setting. In combination with the non-linearity of the complementary copy transistor 32 the AC coupling 34 ensures that the DC setting of the second current mirror is also shifted. Particularly the output currents of both the first and the second current mirror, which would occur if both output transistors had their drain-source voltage above saturation level, must be shifted by the same amount. Of course the relations between the output current and the DC bias voltages at the gates will generally be different for the transistors 8, 9 of the output stage. For example, these relations may depend on the physical properties of the relevant transistors and their initial DC setting. Consequently, the amplitude dependences of first and second DC bias, although equivalent, will generally be different; they should only be equivalent in the sense that they lead to equal changes in output current.

It will be evident from the foregoing that the effect of the amplitude of the oscillating signal upon the duty cycle of the output can be eliminated by adjusting the second DC bias at the gate of the PMOS transistor 9 in the output stage. This may be realized by providing bias-generating means 20 with the oscillating signal, and arranging these means to respond to the amplitude of the oscillating signal in a manner equivalent to the way in which the oscillating stage 1 shifts the first DC bias in dependence on the amplitude. In particular this may be achieved by providing the bias-generating means with a (complementary) copy of at least those components of the oscillating stage which determine the amplitude dependence.

The invention is not limited to the embodiments described and shown in the Figures. For example, the invention is also applicable if PMOS and NMOS transistors are exchanged. The invention is not limited to MOS transistors: bipolar transistors may be used as well. Although a Pierce oscillator arrangement comprising a piezo-electric crystal has been described, it will be evident that oscillators with other known feedback constructions, or for example with an inductance instead of a crystal may alternatively be used in the oscillating stage.

Similarly, the current mirror arrangements used in the oscillating stage/output and the bias-generating means/output may be replaced by other known current arrangements. Examples are current mirrors comprising source followers (for coupling the input branch to the gates of the transistors), darlingtons, cascoded current mirrors, etcetera.

The output stage is not limited to the simple structure shown in the Figures. For example, it may be part of known logic gate structures, using other transistors with their channels in series with, or parallel to, the transistors of the output stage.

I claim:

1. An oscillator circuit comprising an oscillating stage and an output stage, the oscillating stage being coupled to an input of the output stage for feeding an input signal thereto combining a generated oscillating signal with a first DC bias, said first DC bias being dependent on an amplitude of the oscillating signal, the output stage comprising a series arrangement of main current channels of a first and a second output transistor of complementary conductivity types, coupled between a first and a second supply terminal, the input being coupled to a control electrode of the first transistor and, via a capacitor, to a control electrode of the second transistor, a node in the series arrangement between the first and the second transistor being coupled to an output of the oscillator circuit, the output stage, in operation, driving an output voltage to switch substantially between a first and a second output level when the input signal crosses an input switching level, and bias-generating means for generating a second DC bias at a control electrode of the second transistor so as to adjust the input switching level to the median level of the input signal in dependence on the amplitude of the oscillating signal.

2. An oscillator circuit as claimed in claim 1, further comprising an AC coupling between the oscillating stage and the bias-generating means for applying a further oscillating signal of said oscillating signal amplitude to the bias-generating means.

3. An oscillator circuit as claimed in claim 2, in which the oscillating stage comprises a sub-circuit determining the first DC bias and its dependence on the amplitude, wherein for generating the second DC bias, the bias-generating means comprise a circuit which is complementary to the sub-circuit, the AC coupling being arranged to provide equivalent signals in the sub-circuit and the complementary circuit.

4. An oscillator circuit as claimed in claim 3, wherein the oscillating stage comprises a first feedback loop including a control electrode and a main current channel of a third transistor which has its control electrode coupled to the input of the output stage, and the complementary circuit comprises a second feedback loop including a control electrode and a main current channel of a fourth transistor which has its control electrode coupled to the control electrode of the second transistor, the AC coupling comprising a capacitive element connecting the control electrodes of the third and fourth transistors.

5. An oscillator circuit as claimed in claim 1 wherein the bias generating means includes means for deriving said second DC bias as a function of the amplitude of the oscillating signal and for supplying the second DC bias to the control electrode of the second output transistor so as to compensate for the amplitude dependence of the first DC bias, whereby the output voltage duty cycle is maintained at a predetermined value independent of the oscillating signal amplitude.

* * * * *